US010042379B1

(12) United States Patent
Zhou et al.

(10) Patent No.: US 10,042,379 B1
(45) Date of Patent: Aug. 7, 2018

(54) SUB-THRESHOLD LOW-POWER-RESISTOR-LESS REFERENCE CIRCUIT

(71) Applicant: University of Electronic Science and Technology of China, Chengdu (CN)

(72) Inventors: Zekun Zhou, Chengdu (CN); Xiang Li, Chengdu (CN); Yandong Yuan, Chengdu (CN); Yue Shi, Chengdu (CN); Zhuo Wang, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 15/867,717

(22) Filed: Jan. 11, 2018

(30) Foreign Application Priority Data

Dec. 6, 2017 (CN) .......................... 2017 1 1274463

(51) Int. Cl.
*H03K 3/42* (2006.01)
*G05F 3/26* (2006.01)

(52) U.S. Cl.
CPC .................................... *G05F 3/267* (2013.01)

(58) Field of Classification Search
CPC ... G05F 1/56; G05F 3/30; G05F 3/245; G05F 3/262; G05F 3/267; G11C 5/147
USPC ......... 327/530, 534–541, 543; 323/234, 271, 323/312–318
See application file for complete search history.

(56) References Cited

U.S. PATENT DOCUMENTS

| | | | | |
|---|---|---|---|---|
| 7,994,848 | B2 * | 8/2011 | Kothandaraman .... | G11C 5/147 327/539 |
| 8,350,510 | B2 * | 1/2013 | Ogasawara ........... | H02M 3/158 180/443 |
| 8,680,840 | B2 * | 3/2014 | Iacob ...................... | G05F 3/242 323/313 |
| 9,519,304 | B1 * | 12/2016 | Far .......................... | G05F 3/262 |
| 2005/0046470 | A1 * | 3/2005 | Wang ...................... | G05F 3/245 327/543 |

* cited by examiner

*Primary Examiner* — Rajnikant Patel
(74) *Attorney, Agent, or Firm* — Gokalp Bayramoglu

(57) ABSTRACT

A sub-threshold low-power and resistor-less reference circuit which is related to the field of reference circuit technology of analog circuit includes a negative-temperature-coefficient voltage generating circuit, a positive-temperature-coefficient voltage generating circuit and a current balancing circuit. The negative-temperature-coefficient voltage generating circuit generates a negative-temperature-coefficient voltage $V_{CTAT}$ based on the negative-temperature voltage characteristic of base-emitter PN junction of the bipolar tsansistor. On the other hand, the positive-temperature-coefficient voltage generating circuit generates a positive-temperature-coefficient voltage $V_{PTAT}$ based on the positive-temperature voltage characteristic of the NMOS transistor operating in a sub-threshold region. The current balancing circuit is configured to eliminate the error current caused due to the difference of the current mirror when the two voltages with different temperature characteristics are superposed to output a reference voltage.

1 Claim, 2 Drawing Sheets

SUB-THRESHOLD LOW-POWER-RESISTOR-LESS REFERENCE CIRCUIT

CROSS REFERENCE TO RELATED APPLICATIONS

This application is based upon and claims priority to Chinese Patent Application No. 2017112744637, filed on Dec. 6, 2017, the entire contents of which are incorporated herein by reference.

TECHNICCAL FIELD

The present invention relates to the field of reference circuit technology of analog circuits, in particular to a reference circuit whose core circuit operates in a sub-threshold state.

BACKGROUND

The reference circuit is an indispensable part of analog circuits. Other modules of the analog circuit will have an accurate reference point according to the voltage reference point generated by the reference circuit. In fact, as a standard reference point, the reference circuit will work continuously while other analog circuits operate, so the improvement of temperature characteristic and the reduction of power consumption are the eternal topics in the field of reference circuit. In addition, a high power supply rejection ratio and a low operating voltage are also the development directions of the reference circuits.

The reference circuits are divided into two categories depending on whether the resistor is used or not. In general, the reference circuit having resistors has good temperature characteristic, but will occupy a large area of the chip layout, especially in the field of ultra low power reference circuit. If a reference circuit has nano-watt-level power; a resistor of hundreds of mega ohms is required. As a result, the circuit would occupy a large layout area. Therefore, the resistor-less reference circuit is in trend for the low-power reference circuits. However, without the continuous adjustability of the resistors, the temperature characteristic of the -resistor-less reference circuit is generally worse than that of the reference circuit having resistors. Generally, transistors in commonly used reference circuits operate in the saturation region with large current and power. Such a large power is unacceptable in some portable smart medical devices and energy harvesting systems. In order to reduce the power, the application of sub-threshold MOS field-effect transistors in reference circuits is in consideration. However after the sub-threshold MOS field-effect transistors are used, it is difficult to modify the voltage characteristics of the reference circuits, which is also a research direction for low-voltage low-power reference circuits.

SUMMARY OF INVENTION

The purpose of the present invention is to provide a sub-threshold low-power resistor-less reference circuit which is able to work at ultra low power with high accuracy.

The technical solution of the present invention is as follows.

A sub-threshold low-power resistor-less reference circuit comprising a negative-temperature-coefficient voltage generating circuit, a positive-temperature-coefficient voltage generating circuit and a current balancing circuit; wherein the negative-temperature-coefficient voltage generating circuit includes a first NMOS field-effect-transistor MN1, a second NMOS field-effect-transistor MN2, a first PMOS field-effect-transistor MP1, a second PMOS field-effect-transistor MP2 and a PNP bipolar transistor Q1;

a gate terminal of the first PMOS field-effect-transistor MP1 is connected to a gate terminal and a first drain terminal of the second PMOS field-effect-transistor MP2 and is also connected to a drain terminal of the first NMOS field-effect-transistor MN1; a drain terminal of the first PMOS field-effect-transistor MP1 is connected to a gate terminal of the first NMOS field-effect-transistor MN1 and an emitter terminal of PNP bipolar transistor Q1; a source terminal of the first PMOS field-effect-transistor MP1 is connected to a source terminal of the second PMOS field-effect-transistor MP2, wherein, the source terminal of the first PMOS field-effect-transistor MP1 and the source terminal of the second PMOS field-effect-transistor MP2 are both connected to a supply voltage VDD;

a source terminal of the first NMOS field-effect-transistor MN1 is connected to a gate terminal and a drain terminal of the second NMOS field-effect-transistor MN2 and is used as an output terminal of the negative-temperature-coefficient voltage generating circuit; a source terminal of the second NMOS field-effect-transistor MN2 is connected to a base terminal and a collector terminal of the PNP bipolar transistor Q1 and is grounded:

the positive-temperature-coefficient voltage generating circuit includes a third NMOS field-effect-transistor MN3, a fourth NMOS field-effect-transistor MN4, a fifth NMOS field-effect-transistor MN5, a third PMOS field-effect-transistor MP3 and a fourth PMOS field-effect-transistor MP4;

a gate terminal of the third PMOS field-effect-transistor MP3 is connected to a gate terminal and a drain terminal of the fourth PMOS field-effect-transistor MP4 and is also connected to a drain terminal of the fourth NMOS field-effect-transistor MN4; a source terminal of the third PMOS field-effect-transistor MP3 is connected to a source terminal of the fourth PMOS field-effect-transistor MP4 and is connected to the supply voltage VDD; a drain terminal of the third PMOS field-effect-transistor MP3 is connected to a gate terminal and a drain terminal of the third NMOS field-effect-transistor MN3 and is also connected to a gate terminal of the fourth NMOS field-effect-transistor MN4, and the drain terinmal of the third PMOS field-effect-transistor MP3 is further used as an output terminal of the reference circuit to output a reference voltage Vref;

a gate terminal and a drain terminal of the fifth NMOS field-effect-transistor MN5 are short-circuited and connected to a source terminal of the fourth NMOS field-effect-transistor MN4: a source terminal of the fifth NMOS field-effect-transistor MN5 is connected a source terminal of the third NMOS field-effect-transistor MN3 and is further connected to the output terminal of the voltage of the negative-temperature-coefficient voltage generating circuit;

the current balancing circuit includes a sixth NMOS field-effect-transistor MN6, a seventh NMOS field-effect-transistor MN7, an eighth NMOS field-effect-transistor MN8, a ninth NMOS field-effect-transistor MN9, a tenth NMOS field-effect-transistor MN1*a*, an eleventh NMOS field-effect-transistor MN2*a*, a fifth PMOS field-effect-transistor MP5, a sixth PMOS field-effect-transistor MP6 and a seventh PMOS field-effect-transistor MP1*a;* the output terminal of the negative-temperature-coefficient voltage generating circuit is connected to a drain terminal of the sixth NMOS field-effect-transistor MN6, a drain terminal of the ninth NMOS field-effect-transistor MN9 and a gate terminal of the eleventh NMOS field-effect-transistor MN2a; a gate terminal of the sixth NMOS field-effect-transistor MN6 is connected to a gate terminal and a drain terminal of the seventh NMOS field-effect-transistor MP7 and is also connected to a drain ternnnal of the fifth PMOS field-effect-transistor MP5; a gate terminal of the fifth PMOS field-effect-transistor MP5 is connected to a gate terminal of the third PMOS field-effect-transistor MP3 in the positive-temperature-coefficient voltage generating circuit;

a gate terminal and a drain terminal of the eighth NMOS field-effect-transistor MN8 are short-circuited and connected to a gate terminal of the ninth NMOS field-effect-transistor MN9 and a drain terminal of the sixth PMOS field-effect-transistor MP6;

a gate terminal of the seventh PMOS field-effect-transistor MP1a is connected to the gate terminal of the first PMOS field-effect-transistor MP1 in the positive-temperature-coefficient voltage generating circuit; a drain terminal of the seventh PMOS field-effect-transistor MP1a is connected to a gate terminal of the sixth PMOS field-effect-transistor MP6 and a drain terminal of tenth NMOS field-effect-transistor MN1a; a gate terminal of the tenth NMOS field-effect-transistor MN1a is connected to the drain terminal of the first PMOS field-effect-transistor MP1 in the negative-temperature-coefficient voltage generating circuit; a source terminal of the seventh PMOS field-effect-transistor MP1a is connected to a drain terminal of the eleventh NMOS field-effect-transistor MN2a;

source terminals of the seventh PMOS field-effect-transistor MP1a, the sixth PMOS field-effect-transistor MP6 and the fifth PMOS field-effect-transistor MP5 are connected to the supply voltage VDD; source terminals of the sixth NMOS field-effect-transistor MN6. the seventh NMOS field-effect-transistor MN7, the eighth NMOS field-effect-transistor MN8, the ninth NMOS field-effect-transistor MN9 and the eleventh NMOS field-effect-transistor MN2a are grounded; and all the MOS field-effect-transistors work in a sub-threshold state.

The operating principle of the present invention is as follows.

A negative-temperature-coefficient voltage generating circuit generates a negative-temperature-coefficient voltage $V_{CTAT}$ based on the negative-temperature voltage characteristic of base-emitter PN junction of the bipolar transistor r. On the other hand, a positive-temperature-coefficient voltage generating circuit generates a positive-temperature-coefficient voltage $V_{PTAT}$ based on the positive-temperature voltage characteristic of the NMOS transistor operating in a sub-threshold region. The current balancing circuit is configured to eliminate the error current resulting from the current mirror of the third PMOS field-effect-transistor MP3, the fourth PMOS field-effect-transistor MP4 and the current mirror of the sixth NMOS field-effect-transistor MN6, the seventh NMOS field-effect-transistor MN7, due to inaccurate current mirroring operation when the two voltages with, different temperature characteristics are superposed to output a reference voltage.

The advantages of the present invention: compared to present reference circuit, the present invention has extremely low quiescent power and lower operating voltage. In addition, the resistor-less circuit occupies less area in the chip layout. Moreover, the reference voltage is generated by superposing the negative-temperamre-coefficient voltage generated by the bipolar transistor and the positive-temperature-coefficient voltage generated by the MOS field-effect-transistor operating in sub-threshold region, which performs well in temperature characteristic.

DETAILED DESCRIPTION OF THE INVENTION

The present invention will be described in detail hereinafter with reference to the drawings and specific embodiments.

Figure 1:
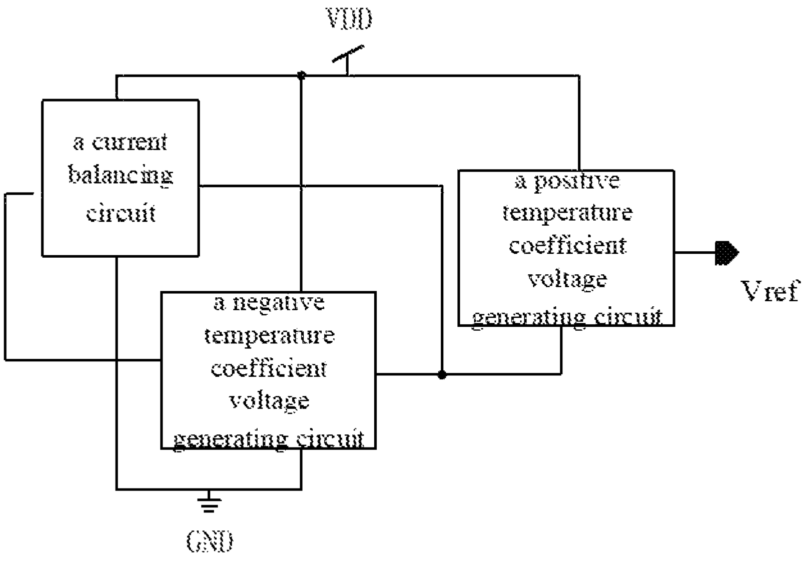
FIG. 1 shows a structural diagram of the sub-threshold low-power resistor-less reference circuit according to the present invention.

The topology structural diagram of the sub-threshold low-power resistor-less reference circuit proposed by the present invention is shown in FIG. 1, which includes a negative-temperature-coefficient voltage generating circuit, a positive-temperature-coefficient voltage generating circuit and a current balancing circuit. The negative-temperature-coefficient voltage generating module generates a negative-temperature-coefficient voltage $V_{CTAT}$ from the base-emitter voltage of the bipolar transistor, while the positive-temperature-coefficient voltage generating module generates a positive-temperature-coefficient voltage $V_{PTAT}$ from the gate-source voltage of the MOS field-effect-transistor operating in sub-threshold region. Subsequently, these two voltages are superposed by a specific way to output the reference voltage. As shown in FIG. 1, the CTAT voltage generated by the CTAT voltage generating circuit is utilized as the ground potential of the PTAT voltage generating circuit. In this way, the output voltage of the PTAT voltage generating circuit is the reference voltage Vref. Finally the current balancing circuit is designed to ensure that no current between the negative-temperature-coefficient voltage generating module and the positive-temperature-coefficient voltage generating module, which have different temperature coefficients affect each other in the operation.

Figure 2:
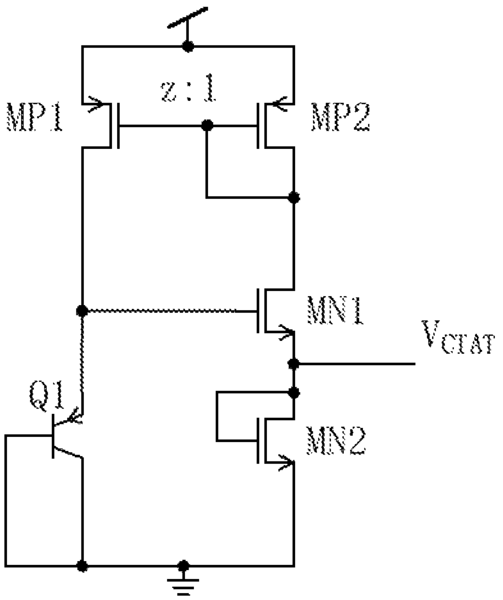
FIG. 2 is a schematic diagram of the negative-temperature-coefficient voltage generating circuit with the bipolar transistor according to the present invention.

FIG. 2 shows the CTAT voltage generating circuit which includes first NMOS field-effect-transistor MN1, second NMOS field-effect-transistor MN2, first PMOS field-effect-transistor MP1, second PMOS field-effect-transistor MP2 and PNP bipolar transistor Q1. The first PMOS field-effect-transistor MP1 and second PMOS field-effect-transistor MP2 constitute a current mirror with a mirror ratio of z:1. The gate terminal of the first PMOS field-effect-transistor MP1 is connected to the gate terminal and drain terminal of the second PMOS field-effect-transistor MP2 and the drain terminal of the first NMOS field-effect-transistor MN1. The drain terminal of the first PMOS field-effect-transistor MP1 is connected to the gate terminal of the first NMOS field-effect-transistor MN1 and the emitter terminal of the PNP bipolar transistor Q1. The source terminal of the first PMOS field-effect-transistor MP1 is connected to the source terminal of the second PMOS field-effect-transistor MP2 and the supply voltage. The source terminal of the first NMOS field-effect-transistor MN1 is connected to the gate terminal and drain terminal of the second NMOS field-effect-transistor MN2 and is used as the output terminal of the negative-temperature-coefficient voltage generating circuit to output the negative-temperature-coefficient voltage $V_{CTAT}$. The source terminal of the second NMOS field-effect-transistor MN2 is connected to the base terminal and collector terminal of the PNP bipolar transistor Q1 and is grounded. The negative-temperature-coefficient voltage generating circuit divides the base-emitter voltage by the MOSFET to gain the negative temperature coefficient voltage $V_{CTAT}$.

In the PNP bipolar transistor branch, the emitter terminal current of PNP bipolar transistor Q1 is estimated as $$I_E = I_{SE}\exp\left(\frac{V_E}{V_T}\right) \tag{1}$$

where $V_T$ is the thermal voltage and $V_E$ is the emitter terminal voltage of the PNP bipolar transistor Q1. Because the base terminal of the PNP bipolar transistor Q1 is grounded at this time, $V_E$ represents the emitter-base voltage $V_{EB}$. $I_{SE}$ is short circuit current between the base terminal and emitter terminal of the bipolar transistor, which is estimated as $$I_{SE} = bT^{4-n_2}\exp\left(\frac{-E_g}{kT}\right) \tag{2}$$

In the formula (2), b represents a constant decided by process; $4-n_2$ represents the temperature coefficient brought by the process; $E_g$ represents the band-gap energy of the band-gap semiconductor material of the PNP bipolar transistor Q1, wherein, in some embodiments, the semiconductor material of the PNP bipolar transistor Q1 is silicon; k represents the Boltzmann constant, and T represents the Kelvin temperature.

In the PTAT voltage generating branch, the current of the first NMOS field-effect-transistor MN1 and the second NMOS field-effect-transistor MN2 which operate in the sub-threshold state is estimated as:

$$I_D = I_{SD}\exp\left(\frac{V_{GS}-V_{TH}}{nV_T}\right) \tag{3}$$

where n represents the sub-threshold slope factor of the MOS field-effect-transistor, $V_{GS}$ represents the gate-source voltage of the MOS field-effect-transistor, $V_{TH}$ represents the threshold voltage of the MOS field-effect-transistor, $I_{SD}$ represents the substrate-drain leakage current per unit area of the MOS field-effect-transistor. $I_{SD}$ is expressed as $$I_{SD}=\mu C_{ox}S(n-1)V_T^2 \tag{4}$$

Where μ, $CO_x$, S represent the mobility, the gate capacitance per unit area, and the aspect ratio, respectively.

The current ratio of the PNP bipolar transistor branch to the voltage dividing MOSFET branch is decided by the aspect ratio z:1 of the current mirror constituted by the first PMOS field-effect-transistor MP1 and the second PMOS field-effect-transistor MP2.

In the present embodiment, to make the first NMOS field-effect-transistor MN1, the second NMOS field-effect-transistor MN2 have the same aspect ratio (actually, the aspect ratio of the first field-effect-transistor MN1, the second field-effect-transistor MN2can be other ratios), the gate-source voltage of the two NMOS field-effect-transistors should be the same. Then, the following equations can be obtained.

$$I_E=zI_{MN1} \tag{5}$$

$$I_{SE}\exp\left(\frac{V_E}{V_T}\right) = zI_{SD}\exp\left(\frac{V_{GS}-V_{TH}}{nV_T}\right) = zI_{SD}\exp\left(\frac{\frac{V_E}{2}-V_{TH}}{nV_T}\right) \tag{6}$$

Hence $V_E$ can be obtained by solve equation (6).

$$V_E = \frac{1}{1-\frac{1}{2n}}\left[V_T\ln\left(\frac{z\mu C_{OX}S(n-1)V_T^2}{bT^{4-n_2}\exp\left(\frac{-E_g}{kT}\right)}\right) - \frac{V_{TH}}{n}\right] \tag{7}$$

In fact, there is also a temperature coefficient of mobility μ, so μ can be written as:

$$\mu=\mu(T_r)T^{-n_1} \tag{8}$$

Since $n_1$ is a temperature coefficient decided by the process, $T_r$ is the reference temperature which is absolute zero here, then:

$$z\mu C_{OX}S(n-1)\left(\frac{k}{q}\right)^2T^2 = CT^{2-n_2} \tag{9}$$

$$C = z\mu(T_r)C_{OX}S(n-1)\left(\frac{k}{q}\right)^2 \tag{10}$$

Thus, the final expression of $V_E$ is $$V_E = \frac{1}{1-\frac{1}{2n}}\left[V_T(\ln(C)-\ln(b)+(n_2-n_1-2)\ln(T)) + \frac{E_g}{q} - \frac{V_{TH}}{n}\right] \tag{11}$$

Finally, the output CTAT voltage $V_{CTAT}$ is half of $V_E$ after divided by two NMOS field-effect-transistors. The temperature coefficient is thus expressed as follows:

$$\frac{\partial V_{CTAT}}{\partial T} = \frac{\partial\frac{V_E}{2}}{\partial T} = \frac{1}{2-\frac{1}{n}}\left[\frac{k}{q}(\ln(C)-\ln(b)) + (n_2-n_1-2)\frac{k}{q}(\ln(T)+1) + \frac{\beta_{TH}}{n}\right] \tag{12}$$

where $\beta_{TH}$ represents the temperature coefficient of threshold voltage $V_{TH}$. Since the dominant term of the negative temperature coefficient is $n_2-n_1-2$ in this reference circuit, it behaves well in linearity than the conventional reference circuits having dominant term of the negative temperature coefficient $n_2-4$ of base-emitter voltage of the bipolar transistor. Meanwhile, this kind of structure with the threshold voltage compensation in it not only reduces the requirement of the power supply voltage, but also decreases the negative temperature characteristic of the voltage $V_{BE}$ compared to the traditional structure.

Figure 3:
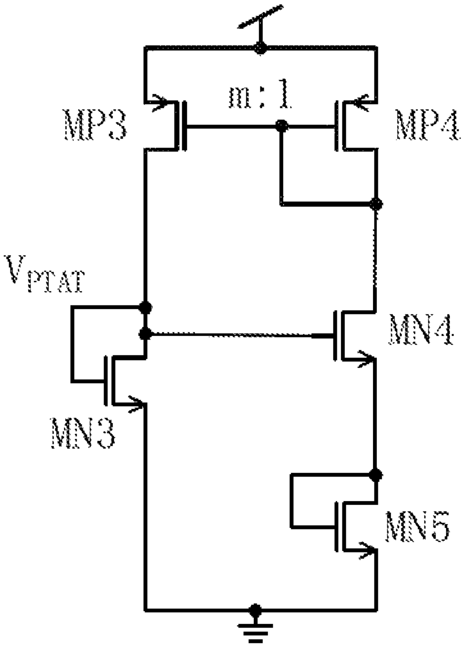
FIG. 3 is a schematic diagram of the positive-temperature-coefficient voltage generating circuit with MOS field-effect-transistor operating in sub-threshold region according to the present invention.

The schematic diagram of the positive-temperature-coefficient voltage generating circuit is shown in FIG. 3. The principle of the PTAT voltage generating circuit is similar as that of the CTAT voltage generating circuit. The divided voltage of the positive-temperature-coefficient voltage generating circuit is the gate-source voltage of the MOSFET operating in sub-threshold region. The positive-temperature-coefficient voltage generating circuit includes third NMOS field-effect-transistor MN3, fourth NMOS field-effect-transistor MN4, fifth NMOS field-effect-transistor MN5, third PMOS field-effect-transistor MP3 and fourth PMOS field-effect-transistor MP4. The gate terminal of the third PMOS field-effect-transistor MP3 is connected to the gate terminal and the drain terminal of the fourth PMOS field-effect-transistor MP4 and a drain terminal of the fourth NMOS field-effect-transistor MN4. The source terminal of the third PMOS field-effect-transistor MP3 is connected to a source terminal of the fourth PMOS field-effect-transistor MP4 and is connected to the supply voltage VDD. The drain terminal of the third PMOS field-effect-transistor MP3 is connected to a gate terminal and a drain terminal of the third NMOS field-effect-transistor MN3 and is also connected to a gate terminal of the fourth NMOS field-effect-transistor MN4, and the drain terminal of the third PMOS field-effect-transistor MP3 is further used as an output terminal of the positive-temperature-coefficient voltage generating circuit to output a positive-temperature-coefficient voltage $V_{PTAT}$ and is also used as an output terminal of the reference circuit to output the reference voltage Vref. The gate terminal and drain terminal of the fifth NMOS field-effect-transistor MN5 are short-circuited and connected to a source terminal of the fourth NMOS field-effect-transistor MN4. The source terminal of the fifth NMOS field-effect-transistor MN5 is connected a source terminal of the third NMOS field-effect-transistor MN3 and is further connected to the output terminal of the voltage of the negative-temperature-coefficient voltage generating circuit. The output voltage of the negative-temperature-coefficient voltage generating circuit is taken as the ground of the positive-temperature-coefficient voltage generating circuit and is connected to the source terminals of the third NMOS field-effect-transistor MN3 and the fifth NMOS field-effect-transistor MN5.

The positive-temperature-coefficient voltage generating circuit has two branches. The ratio of current minor of the third PMOS field-effect-transistor MP3 and the fourth. PMOS field-effect-transistor MP4 is m:1. The drain-source current of NMOS field-effect-transistor operating in the subthreshold region has been given in equation (3), so the following equations can be obtained:

$$I_{MN3}=mI_{MN5} \tag{13}$$

$$S_3 I_{SD}\exp\left(\frac{V_{GS3}-V_{TH}}{nV_T}\right)=mS_5 I_{SD}\exp\left(\frac{\frac{V_{GS3}}{2}-V_{TH}}{nV_T}\right) \tag{14}$$

The source terminal voltage of he third NMOS field-effect-transistor MN3 is the PTAT voltage:

$$V_{PTAT}=V_{GS3}=nV_T\frac{1}{1-\frac{1}{2}}\ln\left(\frac{mS_5}{S_3}\right)=2nV_T\ln\left(\frac{mS_5}{S_3}\right) \tag{15}$$

Then the temperature coefficient of the PTAT voltage is as follows:

$$\frac{\partial V_{PTAT}}{\partial T}=2n\frac{k}{q}\ln\left(\frac{mS_5}{S_3}\right) \tag{16}$$

The reference ground of the positive-temperature-coefficient voltage generating module is the output voltage of the negative-temperature-coefficient voltage generating module, i.e. the negative-temperature-coefficient voltage $V_{CTAT}$. Sixth NMOS field-effect-transistor MN6 is configured to generate a mirror current which equals to a sum of the current of the third PMOS field-effect-transistor MP3 and the current of the fourth PMOS field-effect-transistor MP4 to prevent the current of the positive-temperature-coefficient voltage generating module from flowing into the negative-temperature-coefficient voltage generating module. However, since the drain-source voltage of the sixth NMOS field-effect-transistor MN6 is much smaller than that of the seventh NMOS field-effect-transistor MN7, the current mirror of the sixth NMOS field-effect-transistor MN6 and the seventh NMOS field-effect-transistor MN7 is not very accurate. As a result, the sixth NMOS field-effect-transistor MN6 can't derive all the current of the PTAT voltage generating module well.

Figure 4:
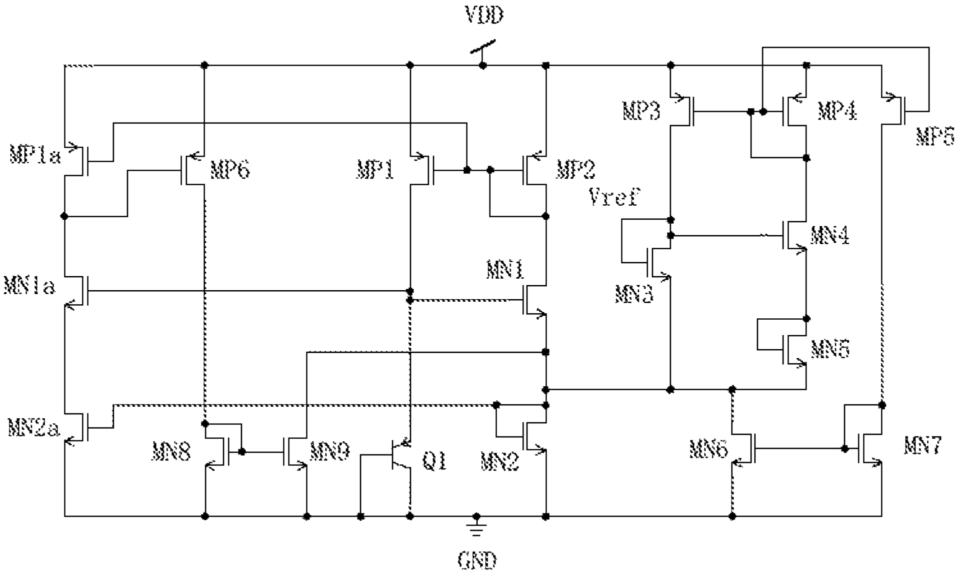
FIG. 4 is an overall structural schematic diagram of the complete sub-threshold low-power resistor-less reference circuit according to the present ention

To resolve the problem, as shown in FIG. 4. the right branch of the CTAT voltage generating circuit is copied. If the error current flows into the second NMOS field-effect-transistor MN2, the gate terminal voltage of the second NMOS field-effect-transistor MN2 would rise. Because the gate terminal of the eleventh NMOS field-effect-transistor MN2*a* is connected to that of the second NMOS field-effect-transistor MN2, the gate voltage of the eleventh NMOS field-effect-transistor MN2*a* would rise, too. Thus, the current of the branch with the second NMOS field-effect-transistor MN2 would increase, which leads to the reduction of the drain voltage of the seventh PMOS field-effect-transistor MP1*a*. As a result, the current of the sixth PMOS field-effect-transistor MP6 and the eighth PMOS field-effect-transistor MPS would increase, and a certain current will be drawn out through the ninth NMOS field-effect-transistor MN9 by the current mirror to eliminate the error current.

The key point of the present invention lies in the application of the positive-temperature-characteristic gate-source voltage of the MOS field-effect-transistor operating in the sub-threshold state and the negative-temperature-characteristic emitter-base voltage providing by bipolar transistor. In addition, the linearity of the emitter-base voltage has been optimized well after divided by MOS field-effect-transistor. Also, a further bright spot is how to combine the two types of voltages accurately by a certain circuit.

Those of ordinary skill in the art may make various specific variations and combinations without departing from the essence of the present invention according to these disclosed techniques in the present invention. However, these variations and combinations should still fall within the scope of the present invention.

What is claimed is:

1. A sub-threshold low-power resistor-less reference circuit comprising a negative-temperature-coefficient voltage generating circuit, a positive-temperature-coefficient voltage generating circuit and a current balancing circuit; wherein the negative-temperature-coefficient voltage generating circuit comprises a first NMOS field-effect-transistor, a second NMOS field-effect-transistor, a first PMOS field-effect-transistor, a second PMOS field-effect-transistor and a PNP bipolar transistor;

a gate terminal of the first PMOS field-effect-transistor is connected to a gate terminal and a drain terminal of the second PMOS field-effect-transistor and is also connected to a drain terminal of the first NMOS field-effect-transistor; a drain terminal of the first PMOS field-effect-transistor is connected to a gate terminal of the first NMOS field-effect-transistor and an emitter terminal of PNP bipolar transistor; a source terminal of the first PMOS field-effect-transistor is connected to a source terminal of the second PMOS field-effect-transistor, wherein, the source terminal of the first PMOS field-effect-transistor and the source terminal of the second PMOS field-effect-transistor are both connected to a supply voltage;

a source terminal of the first NMOS field-effect-transistor is connected to a gate terminal and a drain terminal of the second NMOS field-effect-transistor and is used as an output terminal of the negative-temperature-coefficient voltage generating circuit; a source terminal of the second NMOS field-effect-transistor is connected to a base terminal and a collector terminal of the PNP bipolar transistor and is grounded;

the positive-temperature-coefficient voltage generating circuit comprises a third NMOS field-effect-transistor, a fourth NMOS field-effect-transistor, a fifth NMOS field-effect-transistor, a third PMOS field-effect-transistor and a fourth PMOS field-effect-transistor;

a gate terminal of the third PMOS field-effect-transistor is connected to a gate terminal and a drain terminal of the fourth PMOS field-effect-transistor and is also connected to a drain terminal of the fourth NMOS field-effect-transistor; a source terminal of the third PMOS field-effect-transistor is connected to a source terminal of the fourth PMOS field-effect-transistor and is connected to the supply voltage; a drain terminal of the third PMOS field-effect-transistor is connected to a gate terminal and a drain terminal of the third NMOS field-effect-transistor and is also connected to a gate terminal of the fourth NMOS field-effect-transistor, and the drain terminal of the third PMOS field-effect-transistor is further used as an output terminal of the reference circuit to output a reference voltage Vref;

a gate terminal and a drain terminal of the fifth NMOS field-effect-transistor are short-circuited and connected to a source terminal of the fourth NMOS field-effect-transistors a source terminal of the fifth NMOS field-effect-transistor is connected a source terminal of the third NMOS field-effect-transistor and is further connected to the output terminal of the voltage of the negative-temperature-coefficient voltage generating circuit;

the current balancing circuit comprises a sixth NMOS field-effect-transistor, a seventh NMOS field-effect-transistor, an eighth NMOS field-effect-transistor, a ninth NMOS field-effect-transistor, a tenth NMOS field-effect-transistor, an eleventh NMOS field-effect-transistor, a fifth PMOS field-effect-transistor, a sixth PMOS field-effect-transistor and a seventh PMOS field-effect-transistor;

the output terminal of the negative-temperature-coefficient voltage generating circuit is connected to a drain terminal of the sixth NMOS field-effect-transistor, a drain terminal of the ninth NMOS field-effect-transistor and a gate terminal of the eleventh NMOS field-effect-transistor; a gate terminal of the sixth NMOS field-effect-transistor is connected to a gate terminal and a drain terminal of the seventh NMOS field-effect-transistor and is also connected to a drain terminal of the fifth PMOS field-effect-transistor; a gate terminal of the fifth PMOS field-effect-transistor is connected to a gate terminal of the third PMOS field-effect-transistor in the positive-temperature-coefficient voltage generating circuit;

a gate terminal and a drain terminal of the eighth NMOS field-effect-transistor are short-circuited and connected to a gate terminal of the ninth NMOS field-effect-transistor and a drain terminal of the sixth PMOS field-effect-transistor;

a gate terminal of the seventh PMOS field-effect-transistor is connected to the gate terminal of the first PMOS field-effect-transistor in the positive-temperature-coefficient voltage generating circuit; a drain terminal of the seventh PMOS field-effect-transistor is connected to a gate terminal of the sixth PMOS field-effect-transistor and a drain terminal of tenth NMOS field-effect-transistor; a gate terminal of the tenth NMOS field-effect-transistor is connected to the drain terminal of the first PMOS field-effect-transistor in the negative-temperature-coefficient voltage generating circuit; a source terminal of the seventh PMOS field-effect-transistor is connected to a drain terminal of the eleventh NMOS field-effect-transistor;

source terminals of the seventh PMOS field-effect-transistor, the sixth PMOS field-effect-transistor and the fifth PMOS field-effect-transistor are connected to the supply voltage; source terminals of the sixth NMOS field-effect-transistor, the seventh NMOS field-effect-transistor, the eighth NMOS field-effect-transistor, the ninth NMOS field-effect-transistor and the eleventh NMOS field-effect-transistor are grounded; and all the MOS field-effect-transistors work in a sub-threshold state.

* * * * *